(12) United States Patent
Aikawa et al.

(10) Patent No.: US 11,948,825 B2
(45) Date of Patent: Apr. 2, 2024

(54) WAFER PLACEMENT TABLE

(71) Applicant: NGK INSULATORS, LTD., Nagoya (JP)

(72) Inventors: Kenichiro Aikawa, Handa (JP); Hiroshi Takebayashi, Handa (JP); Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 326 days.

(21) Appl. No.: 17/465,943

(22) Filed: Sep. 3, 2021

(65) Prior Publication Data

US 2021/0398840 A1 Dec. 23, 2021

Related U.S. Application Data

(63) Continuation of application No. PCT/JP2020/022832, filed on Jun. 10, 2020.

(30) Foreign Application Priority Data

Jun. 28, 2019 (JP) .................................. 2019-121490

(51) Int. Cl.
*H01L 21/683* (2006.01)

(52) U.S. Cl.
CPC ................................. *H01L 21/6833* (2013.01)

(58) Field of Classification Search
CPC .............. H01L 21/683; H01L 21/6831; H01L 21/6833; H01L 21/68785; C04B 35/117;

(Continued)

(56) References Cited

U.S. PATENT DOCUMENTS

2005/0098120 A1 5/2005 Maki
2007/0223175 A1 9/2007 Morioka et al.
(Continued)

FOREIGN PATENT DOCUMENTS

JP  H07-297265 A   11/1995
JP  2003-179127 A1  6/2003
(Continued)

OTHER PUBLICATIONS

English translation of the International Preliminary Report on Patentability (Chapter I) dated Jan. 6, 2022 (Application No. PCT/JP2020/022832).

(Continued)

*Primary Examiner* — Tuan T Dinh
(74) *Attorney, Agent, or Firm* — BURR PATENT LAW, PLLC

(57) ABSTRACT

A wafer placement table includes: an electrostatic chuck that is a ceramic sintered body in which an electrode for electrostatic adsorption is embedded; a cooling member which is bonded to a surface on an opposite side of a wafer placement surface of the electrostatic chuck, and cools the electrostatic chuck; a hole for power supply terminal, the hole penetrating the cooling member in a thickness direction; and a power supply terminal which is bonded to the electrode for electrostatic adsorption from the surface on the opposite side of the wafer placement surface of the electrostatic chuck, and is inserted in the hole for power supply terminal. The outer peripheral surface of a portion of the power supply terminal is covered with an insulating thin film that is formed by coating of an insulating material, the portion being inserted in the hole for power supply terminal.

3 Claims, 2 Drawing Sheets

(58) Field of Classification Search
CPC .............. C04B 35/645; C04B 35/6261; C04B 35/6264
USPC ................................................ 361/230–234
See application file for complete search history.

(56) References Cited

U.S. PATENT DOCUMENTS

| | | | |
|---|---|---|---|
| 2008/0062609 A1* | 3/2008 | Himori | ............... H01L 21/6833 361/234 |
| 2008/0276865 A1 | 11/2008 | Nishimizu et al. | |
| 2011/0149462 A1* | 6/2011 | Kugimoto | ........... H01L 21/6831 252/520.5 |
| 2014/0355169 A1* | 12/2014 | Maeta | ................. H01L 21/6831 361/234 |
| 2017/0133258 A1* | 5/2017 | Miwa | .................. H01L 21/6831 |
| 2018/0269097 A1* | 9/2018 | Maeta | ................. H01L 21/6831 |
| 2019/0019713 A1* | 1/2019 | Hidaka | ............... H01L 21/6833 |
| 2019/0019714 A1* | 1/2019 | Kosakai | .............. H01L 21/6833 |
| 2019/0088517 A1* | 3/2019 | Kosakai | ............ H01L 21/67103 |
| 2021/0013081 A1* | 1/2021 | Kosakai | ................ C04B 35/575 |

FOREIGN PATENT DOCUMENTS

| | | |
|---|---|---|
| JP | 2004-095665 A | 3/2004 |
| JP | 4034145 B2 | 1/2008 |
| JP | 2008-160097 A | 7/2008 |
| KR | 10-2007-0096891 A | 10/2007 |

OTHER PUBLICATIONS

International Search Report and Written Opinion (Application No. PCT/JP2020/022832) dated Sep. 15, 2020.
Japanese Office Action (with English translation) dated Aug. 16, 2022 (Application No. 2021-528135).
Korean Office Action (Application No. 10-2021-7033957) dated Jul. 18, 2023 (with English translation) (11 pages).

* cited by examiner

WAFER PLACEMENT TABLE

BACKGROUND OF THE INVENTION

1. Field of the Invention

The present invention relates to a wafer placement table.

2. Description of the Related Art

A wafer placement table that sucks and holds a wafer has been conventionally used in transfer, exposure, a film deposition process such as CVD, washing, etching, and microfabrication such as dicing, for a semiconductor wafer. As shown in PTL 1, such a wafer placement table is known, which includes an electrostatic chuck that is a ceramic sintered body in which an electrode for electrostatic adsorption is embedded; a cooling member that cools the electrostatic chuck; and a power supply terminal which is inserted in a hole for power supply terminal and bonded to the electrode for electrostatic adsorption, the hole penetrating the cooling member in a thickness direction. The electrostatic chuck and the cooling member are bonded via an adhesive layer. The outer periphery of the power supply terminal is surrounded by an insulating material. An example of the structure of the surroundings of the power supply terminal of such a wafer placement table is shown in FIG. 2. A ceramic sleeve made of an insulating material is bonded to the outer peripheral surface of a portion of the power supply terminal, the portion being inserted in the hole for power supply terminal of the cooling member. In other words, the power supply terminal is fixed within the hole for power supply terminal by an adhesive layer with the power supply terminal inserted in the hole which vertically penetrates the ceramic sleeve. The ceramic sleeve is produced by cutting machining, thus needs a certain thickness.

CITATION LIST

Patent Literature

PTL 1: Japanese Patent No. 4034145

SUMMARY OF THE INVENTION

However, if the ceramic sleeve is thick, the diameter of the hole for power supply terminal to be opened in the cooling member also needs to be increased, thus the temperature uniformity of the wafer placement surface and the wafer may be degraded. Specifically, the hole for power supply terminal opened in the cooling member is a singular section where heat removal (arrow of FIG. 2) of heat input from plasma is not made directly downward, and when the diameter of the hole is large, the singular section is increased. Thus, the temperature uniformity of the wafer placement surface and the wafer is degraded.

The present invention has been devised to solve such a problem, and it is a main object to improve the temperature uniformity of the wafer placement surface and the wafer.

A wafer placement table of the present invention includes:
  an electrostatic chuck that is a ceramic sintered body in which an electrode for electrostatic adsorption is embedded;
  a cooling member which is bonded or joined to a surface on an opposite side of a wafer placement surface of the electrostatic chuck, and cools the electrostatic chuck;
  a hole for power supply terminal, the hole penetrating the cooling member in a thickness direction; and
  a power supply terminal which is bonded to the electrode for electrostatic adsorption from the surface on the opposite side of the wafer placement surface of the electrostatic chuck, and is inserted in the hole for power supply terminal,
  wherein an outer peripheral surface of a portion of the power supply terminal is covered with an insulating thin film that is formed by coating of an insulating material, the portion being inserted in the hole for power supply terminal.

In the wafer placement table, the outer peripheral surface of the portion of the power supply terminal, inserted in the hole for power supply terminal is covered with an insulating thin film that is formed by coating of an insulating material. Therefore, the diameter of the hole for power supply terminal provided in the cooling member can be reduced according to the diameter of a portion of the power supply terminal, the portion being covered with an insulating thin film. Although the hole for power supply terminal is a singular section where heat removal of heat input from plasma is not made directly downward, the diameter of the hole for power supply terminal can be reduced, thus the singular section can be decreased, and eventually, the temperature uniformity of the wafer placement surface and the wafer is improved.

In the wafer placement table of the present invention, the insulating thin film may be an aerosol deposition (AD) film or a thermal spray film. Particularly, an AD method (including a plasma AD method) is suitable for forming a thin film of fine ceramic particles with high accuracy. In addition, the AD method allows a film of ceramic particles to be formed by an impact consolidation phenomenon, thus it is not necessary to sinter ceramic particles at a high temperature.

In the wafer placement table of the present invention, the thickness of the insulating thin film may be 10 μm or more and 200 μm or less. In this setting, the diameter of the hole for power supply terminal can be further reduced.

In the wafer placement table of the present invention, the gap between the outer surface of the insulating thin film and the inner surface of the hole for power supply terminal may be 1 mm or less. In this setting, the diameter of the hole for power supply terminal can be further reduced.

DETAILED DESCRIPTION OF THE INVENTION

Figure 1:
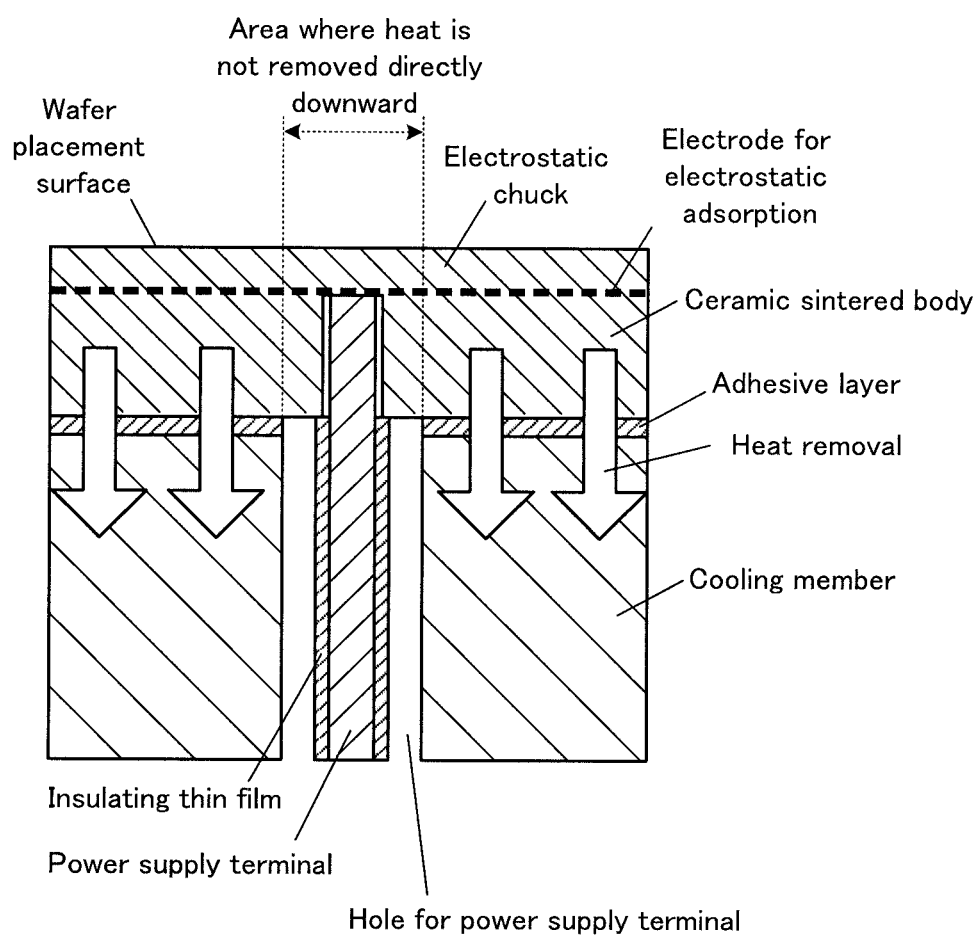
FIG. 1 is a vertical cross-sectional view of a main part of a wafer placement stand of the present embodiment.
Figure 2:
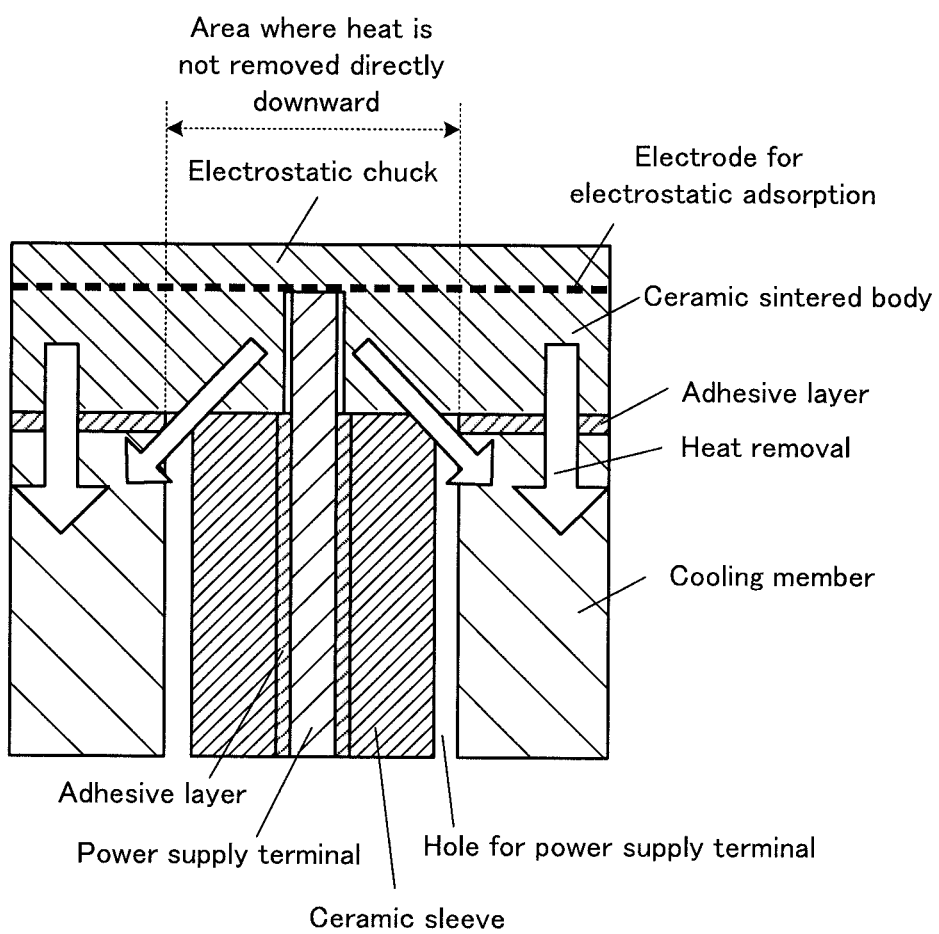
FIG. 2 is a vertical cross-sectional view of a main part of a conventional wafer placement table.

A preferred embodiment of the present invention will be described below with reference to the drawings. FIG. 1 is a vertical cross-sectional view of a main part of a wafer placement table of the present embodiment.

As shown in FIG. 1, the wafer placement table includes an electrostatic chuck, a cooling member, a hole for power supply terminal, and a power supply terminal. The electrostatic chuck is a disc-shaped ceramic sintered body in which an electrode for electrostatic adsorption is embedded, and when a voltage is applied to the electrode for electrostatic adsorption, a wafer (not shown) placed on the wafer placement surface of the electrostatic chuck is electrostatically adsorbed by the electrostatic chuck. The cooling member is a metal member having a cooling medium passage (not shown) inside, and cools the electrostatic chuck. The hole for power supply terminal penetrates the cooling member in a thickness direction. The power supply terminal is waxbonded to the electrode for electrostatic adsorption from the surface on the opposite side of the wafer placement surface of the electrostatic chuck, and is inserted in the hole for power supply terminal. The material for the power supply terminal includes, for example, molybdenum, titanium, and nickel. The outer peripheral surface of the portion of the power supply terminal, inserted in the hole for power supply terminal is covered with an insulating thin film that is formed by coating of an insulating material (for example, alumina).

In the wafer placement table of the present embodiment described above, the outer peripheral surface of the portion of the power supply terminal, inserted in the hole for power supply terminal is covered with an insulating thin film that is formed by coating of an insulating material. Therefore, the diameter of the hole for power supply terminal provided in the cooling member can be reduced according to the diameter of a portion of the power supply terminal, the portion being covered with an insulating thin film. Although the hole for power supply terminal is a singular section where heat removal of heat input from plasma is not made directly downward, the diameter of the hole for power supply terminal can be reduced, thus the singular section can be decreased, and eventually, the temperature uniformity of the wafer placement surface and the wafer is improved.

In addition, the insulating thin film is preferably an AD film or a thermal spray film, and the AD film is more preferable. The AD method is suitable for forming a thin film of fine ceramic particles with high accuracy. In addition, the AD method allows a film of ceramic particles to be formed by an impact consolidation phenomenon, thus it is not necessary to sinter ceramic particles at a high temperature.

Furthermore, it is preferable that the thickness of the insulating thin film be 10 µm or more and 200 µm or less. In addition, it is preferable that the gap between the outer surface of the insulating thin film and the inner surface of the hole for power supply terminal be 1 mm or less. In this setting, the diameter of the hole for power supply terminal can be further reduced.

Note that a heater electrode (resistance heating element) may be embedded or an RF electrode may be embedded in the electrostatic chuck.

The present invention is not limited to the above-described embodiment, and can be carried out by various modes as long as they belong to the technical scope of the invention.

The present application claims priority from Japanese Patent Application No. 2019-121490 filed Jun. 28, 2019, the entire contents of which are incorporated herein by reference.

What is claimed is:

1. A wafer placement table comprising:
   an electrostatic chuck that is a ceramic sintered body in which an electrode for electrostatic adsorption is embedded;
   a cooling member which is bonded or joined to a surface on an opposite side of a wafer placement surface of the electrostatic chuck, and cools the electrostatic chuck;
   a hole for power supply terminal, the hole penetrating the cooling member in a thickness direction; and
   a power supply terminal which is bonded to the electrode for electrostatic adsorption from the surface on the opposite side of the wafer placement surface of the electrostatic chuck, and is inserted in the hole for power supply terminal,
   wherein an outer peripheral surface of a portion of the power supply terminal is covered with a ceramic based insulating thin film that is formed by coating of a ceramic based insulating material, the portion being inserted in the hole for power supply terminal; and
   wherein a thickness of the ceramic based insulating thin film is 10 µm or more and 200 µm or less; and
   wherein the ceramic based insulating thin film is an aerosol deposition film.

2. The wafer placement table according to claim 1, wherein a gap between an outer surface of the ceramic based insulating thin film and an inner surface of the hole for power supply terminal is 1 mm or less.

3. The wafer placement table according to claim 1, wherein the ceramic based insulating thin film comprises alumina.

* * * * *